United States Patent
Zhong et al.

(10) Patent No.: US 11,778,931 B2
(45) Date of Patent: Oct. 3, 2023

(54) DIFFUSION BARRIER LAYER IN PROGRAMMABLE METALLIZATION CELL

(71) Applicant: Taiwan Semiconductor Manufacturing Company, Ltd., Hsin-Chu (TW)

(72) Inventors: Albert Zhong, Taichung (TW); Cheng-Yuan Tsai, Chu-Pei (TW); Hai-Dang Trinh, Hsinchu (TW); Shing-Chyang Pan, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/868,824

(22) Filed: Jul. 20, 2022

(65) Prior Publication Data
US 2022/0367801 A1    Nov. 17, 2022

Related U.S. Application Data

(62) Division of application No. 16/807,600, filed on Mar. 3, 2020, now Pat. No. 11,594,678.

(51) Int. Cl.
| | |
|---|---|
| *H01L 27/24* | (2006.01) |
| *H01L 45/00* | (2006.01) |
| *H10N 70/00* | (2023.01) |
| *H10B 63/00* | (2023.01) |
| *H10N 70/20* | (2023.01) |

(52) U.S. Cl.
CPC ........... *H10N 70/828* (2023.02); *H10B 63/30* (2023.02); *H10N 70/041* (2023.02); *H10N 70/063* (2023.02); *H10N 70/245* (2023.02); *H10N 70/826* (2023.02); *H10N 70/8416* (2023.02)

(58) Field of Classification Search
CPC ............... H10N 70/828; H10N 70/041; H10N 70/063; H10N 70/245; H10N 70/826; H10N 70/8416; H10N 70/011; H10N 70/061; H10N 70/841; H10N 70/881; H10B 63/30; H10B 63/80
See application file for complete search history.

(56) References Cited

U.S. PATENT DOCUMENTS

| | | | |
|---|---|---|---|
| 7,453,111 B2 | 11/2008 | Ryoo et al. | |
| 8,456,891 B2 * | 6/2013 | Baek .............. | H10N 70/24 |
| | | | 257/4 |

(Continued)

OTHER PUBLICATIONS

Notice of Allowance dated Oct. 24, 2022 for U.S. Appl. No. 16/807,600.

(Continued)

*Primary Examiner* — David Vu
(74) *Attorney, Agent, or Firm* — Eschweiler & Potashnik, LLC

(57) ABSTRACT

Some embodiments relate to a method for forming an integrated chip. The method includes forming a bottom electrode over a substrate. A data storage layer is formed on the bottom electrode. A diffusion barrier layer is formed over the data storage layer. The diffusion barrier layer has a first diffusion activation temperature. A top electrode is formed over the diffusion barrier layer. The top electrode has a second diffusion activation temperature less than the first diffusion activation temperature.

20 Claims, 7 Drawing Sheets

(56) References Cited

U.S. PATENT DOCUMENTS

| | | |
|---|---|---|
| 8,866,122 B1 | 10/2014 | Lee et al. |
| 9,058,873 B2 | 6/2015 | Shimuta et al. |
| 10,497,864 B2 | 12/2019 | Lee |
| 10,504,963 B2 | 12/2019 | Yang et al. |
| 10,693,062 B2 | 6/2020 | Narayanan et al. |
| 11,094,745 B2 | 8/2021 | Kim et al. |
| 2009/0028213 A1 | 1/2009 | Kund |
| 2011/0291066 A1 | 12/2011 | Baek et al. |
| 2013/0214234 A1 | 8/2013 | Gopalan et al. |
| 2014/0246641 A1 | 9/2014 | Jameson, III et al. |
| 2014/0264237 A1 | 9/2014 | Chen et al. |
| 2016/0064664 A1 | 3/2016 | Dang et al. |
| 2019/0165266 A1 | 5/2019 | Trinh et al. |

OTHER PUBLICATIONS

Non-Final Office Action dated Nov. 19, 2021 for U.S. Appl. No. 16/807,600.

Non-Final Office Action dated May 13, 2022 for U.S. Appl. No. 16/807,600.

\* cited by examiner

DIFFUSION BARRIER LAYER IN PROGRAMMABLE METALLIZATION CELL

REFERENCE TO RELATED APPLICATION

This application is a Divisional of U.S. application Ser. No. 16/807,600, filed on Mar. 3, 2020, the contents of which are hereby incorporated by reference in their entirety.

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Programmable metallization cell (PMC) random-access memory (RAM), which may also be referred to as conductive-bridging RAM, CBRAM, Nanobridge, or electrolytic memory, is one promising candidate for next generation non-volatile electronic memory due to advantages over current electronic memory. Compared to current non-volatile memory, such as flash random-access memory, PMCRAM typically has better performance and reliability. Compared to current volatile memory, such as dynamic random-access memory (DRAM) and static random-access memory (SRAM), PMCRAM typically has better performance and density, with lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
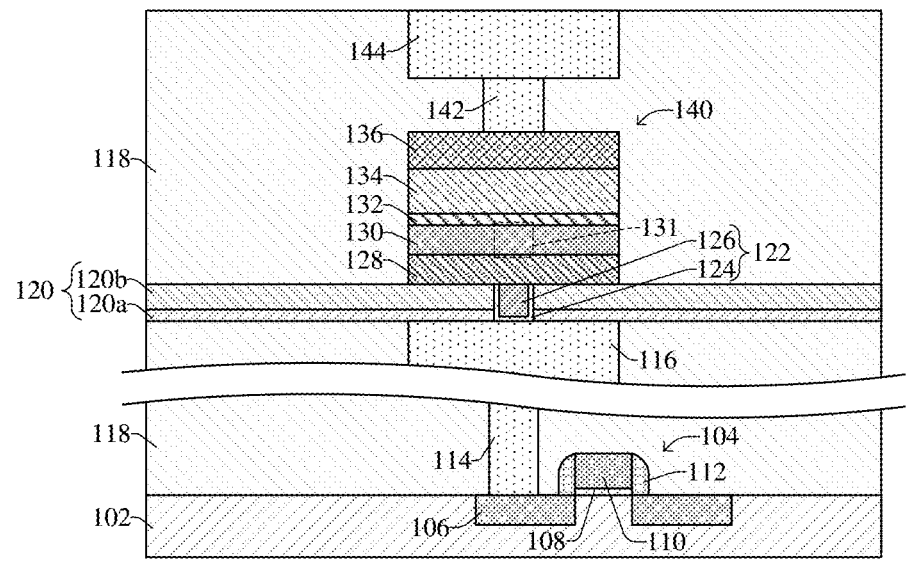
FIG. 1 illustrates a cross-sectional view of some embodiments of a memory device having a programmable metallization cell that includes a diffusion barrier layer overlying a data storage layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A programmable metallization cell generally includes a data storage layer arranged between a top electrode and a bottom electrode. An active metal layer may be disposed between the data storage layer and the top electrode. During a set operation a set voltage is applied across the top and bottom electrodes, such that a conductive bridge is formed within the data storage layer (e.g., resulting in a low resistance state). While applying the set voltage, ions may travel from the active metal layer to the data storage layer, thereby forming the conductive bridge within the data storage layer. During a reset operation a reset voltage is applied across the top and bottom electrodes, such that the conductive bridge may at least be partially removed from the data storage layer (e.g., resulting in a high resistance state). While applying the reset voltage, ions may travel from the data storage layer to the active metal layer, thereby at least partially dissolving the conductive bridge within the data storage layer.

The top electrode may be or comprise a diffusive species, such as, for example, titanium, tantalum, a nitride of the foregoing, or the like. Before operation of the programmable metallization cell (i.e., before applying the set and/or reset voltages), a baking process may be performed on the programmable metallization cell to verify data retention of the programmable metallization cell at high temperatures (e.g., about 400 degrees Celsius). The high temperatures of the baking process may result in problems, such as causing diffusion of the diffusive species from the top electrode to the active metal layer and/or the data storage layer. After performing the baking process, set and/or reset operations may be performed on the programmable metallization cell. During a set operation, the diffusive species may align with the ions from the active metal layer to form the conductive bridge within the data storage layer. However, in some embodiments, the reset voltage may be unable to remove the diffusive species from the data storage layer, such that at least a portion of the conductive bridge may remain within the data storage layer after applying the reset voltage. Thus, the programmable metallization cell may be unable to switch between the high resistance state and the low resistance state. Further, the buildup of the diffusive species within the data storage layer may effectively reduce an effective thickness of the data storage layer, thereby decreasing a breakdown voltage of the programmable metallization cell and/or causing undesired switching into the high resistance state. Furthermore, high heat may accumulate between the data storage layer and the top electrode due to the formation and/or removal of the conductive bridge. The high heat may further increase the diffusion of the diffusive species into the data storage layer, thereby further decreasing a performance and/or endurance of the programmable metallization cell.

Some embodiments of the present disclosure relate to a programmable metallization cell that includes a diffusion barrier layer disposed between a data storage layer and a top electrode. The data storage layer is disposed between the top electrode and a bottom electrode. An active metal layer is disposed between the top electrode and the data storage layer. The top and bottom electrodes each has a lower reactivity to oxygen than the active metal layer. The top electrode may comprise a diffusive species (e.g., titanium, tantalum, a nitride of the foregoing, etc.). The diffusion barrier layer is configured to prevent and/or block diffusion of the diffusive species from the top electrode and/or the active metal layer into the data storage layer. Thus, the diffusion barrier layer mitigates and/or eliminates buildup of the diffusive species in the data storage layer, such that the reset voltage may dissolve the conductive bridge within the data storage layer. This in turn increases a performance, endurance, and/or reliability of the programmable metallization cell.

FIG. 1 illustrates a cross-sectional view of some embodiments of a memory device 100 having a programmable metallization cell 140 that includes a diffusion barrier layer 132 overlying a data storage layer 130. The programmable metallization cell 140 may, for example, be a cation-type resistive random-access memory (RRAM) cell or some other suitable type of RRAM cell. Note that the cation-type RRAM cell may, for example, be referred to as a programmable metallization cell (PMC) or a conductive-bridging random-access memory (CBRAM) cell.

The memory device 100 includes a substrate 102 and the programmable metallization cell 140 overlying the substrate 102. An interconnect dielectric structure 118 overlies the substrate 102. A lower conductive via 114 is disposed within the interconnect dielectric structure 118 and overlies the substrate 102. In some embodiments, a semiconductor device 104 may be disposed within and/or over the substrate 102. In some embodiments, the semiconductor device 104 may, for example, be configured as a transistor. In such embodiments, the semiconductor device 104 includes source/drain regions 106, a gate dielectric layer 108, a gate electrode 110, and a sidewall spacer structure 112. In some embodiments, the lower conductive via 114 overlies a source/drain region 106 of the semiconductor device 104.

A lower conductive wire 116 is disposed within the interconnect dielectric structure 118 and overlies the lower conductive via 114, such that the lower conductive wire 116 is electrically coupled to the semiconductor device 104. A dielectric structure 120 is disposed along an upper surface of the lower conductive wire 116. The dielectric structure 120 includes a lower dielectric layer 120a and an upper dielectric layer 120b. The programmable metallization cell 140 is disposed within the interconnect dielectric structure 118 and overlies a bottom electrode via 122. The bottom electrode via 122 may include a conductive liner 124 and a conductive structure 126, in which the conductive liner 124 laterally surrounds the conductive structure 126. In some embodiments, the programmable metallization cell 140 includes a bottom electrode 128, the data storage layer 130, the diffusion barrier layer 132, an active metal layer 134, and a top electrode 136. An upper conductive via 142 overlies the top electrode 136 and an upper conductive wire 144 overlies the upper conductive via 142. In some embodiments, the active metal layer 134 may be configured as an ion reservoir layer.

During operation of the programmable metallization cell 140, a conductive bridge may be repeatedly formed and dissolved within a region 131 of the data storage layer 130 to change the programmable metallization cell 140 between a low resistance state and a high resistance state. While forming the conductive bridge, a set voltage is applied between the top and bottom electrodes 136, 128. The set voltage may induce oxidation of the active metal layer 134 and forms metal cations. Further, an electric field from the set voltage causes the metal cations to migrate to the data storage layer 130 and to reduce into the conductive bridge within the region 131. While dissolving or removing the conductive bridge, a reset voltage is applied between the top and bottom electrodes 136, 128. The reset voltage may induce oxidation of the conductive bridge and form metal cations. Further, an electric field from the reset voltage causes the metal cations to migrate to the active metal layer 134 and to reduce into the active metal layer 134.

The top and bottom electrodes 136, 128 and the active metal layer 134 are conductive. However, the active metal layer 134 is electrochemically active compared to the top and bottom electrodes 136, 128. Hence, the top and bottom electrodes 136, 128 have lower reactivates with oxygen than the active metal layer 134 and depend upon more energy to oxidize than the active metal layer 134. For example, the top and bottom electrodes 136, 128 may depend upon 5 or more electron volts (eV) to oxidize, whereas the active metal layer 134 may depend upon 3 or less eV to oxidize. Other eV values are, however, amenable. The top and/or the bottom electrodes 136, 128 may, for example, be or comprise titanium, tantalum, titanium nitride, tantalum nitride, some other suitable material(s), or any combination of the foregoing.

The data storage layer 130 may be a solid electrolyte for metal cations that result from oxidation of the active metal layer 134. For example, where the active metal layer 134 is or comprises aluminum, the data storage layer 130 may be a solid electrolyte for aluminum cations. In some embodiments, the data storage layer 130 is or comprises silicon oxide (e.g., $SiO_2$), hafnium oxide (e.g., $HfO_2$), silicon nitride (e.g., $SiN_x$), aluminum oxide (e.g., $Al_2O_3$), zirconium oxide (e.g., $ZrO2$), tantalum oxide (e.g., $TaO_x$), titanium oxide (e.g., $TiO_x$), aluminum nitride, some other suitable dielectric(s), or any combination of the foregoing. Further, in some embodiments, the data storage layer 130 is or comprises germanium sulfur (e.g., GeS), germanium selenium (e.g., GeSe), germanium tellurium (e.g., GeTe), a metal oxide, amorphous silicon, some other suitable electrolyte(s), or any combination of the foregoing.

In some embodiments, the top electrode 136 may be or comprise a diffusive species (e.g., titanium, tantalum, a metal nitride(s) of the foregoing, etc.). In yet further embodiments, the diffusion barrier layer 132 may, for example, be or comprise ruthenium, iridium, tungsten, some other suitable diffusion barrier material, or the like. In some embodiments, the diffusion barrier layer 132 may be or comprise a single material (e.g., ruthenium, iridium, or tungsten), such that the diffusion barrier layer 132 is a continuous layer of the single material. In some embodiments, the diffusion barrier layer 132 is conductive and/or is configured to block or otherwise slow diffusion of the diffusive species to the data storage layer 130 and/or the active metal layer 134. In some embodiments, the diffusion barrier layer 132 comprises a low diffusivity material (e.g., ruthenium, iridium, or tungsten) that blocks or otherwise slows diffusion of the diffusive species. For example, by virtue of the diffusion barrier layer 132 comprising a single continuous layer of the low diffusivity material it may have grain sizes that are smaller than grain sizes of the top electrode 136, such that the diffusive species may not travel across grain boundaries of the diffusion barrier layer 132 to the data storage layer 130. In yet further embodiments, the diffusion barrier layer 132 may not comprise grain boundaries (e.g., the diffusion barrier layer 132 may have an amorphous structure), thereby increasing a diffusion-path complexity for the diffusive species of the top electrode 136. Alternatively, in some embodiments, the diffusion barrier layer 132 has a monocrystalline structure and metal grains of the top electrode 136 are equiaxed grains, thereby increasing the diffusion-path complexity for the diffusive species. Thus, the diffusion barrier layer 132 increases diffusion-path complexity for the diffusive species, thereby blocking or slowing diffusion of the diffusive species from the top electrode 136 to the data storage layer 130.

In some embodiments, the top electrode 136 may have a low diffusion activation temperature (e.g., less than about 400 degrees Celsius). A diffusion activation temperature may be a temperature in which atoms from a structure and/or layer may diffuse from the structure and/or layer to another structure. In yet further embodiments, the diffusion barrier layer 132 may have a high diffusion activation temperature (e.g., greater than about 400 degrees Celsius). In some embodiments, after fabricating the programmable metallization cell 140, a baking process may be performed on the programmable metallization cell 140 to verify data retention of the programmable metallization cell 140 at high temperatures (e.g., about 400 degrees Celsius). In some embodiments, the high temperatures are greater than the low diffusion activation temperature. However, by virtue of the high diffusion activation temperature, atoms from the diffusion barrier layer 132 may not diffuse out of the diffusion barrier layer during the baking process. Further, the diffusion barrier layer 132 may prevent or mitigate diffusion of the diffusive species from the top electrode 136 to the data storage layer 130 during the baking process. By preventing the diffusion of the diffusive species, the diffusion barrier layer 132 increases discrete data states of the programmable metallization cell 140 and increases a number of set and/or reset operations that may be performed on the programmable metallization cell 140. Thus, the diffusion barrier layer 132 increases a performance, endurance, and reliability of the programmable metallization cell 140.

In yet further embodiments, the bottom electrode 128 may comprise a material different from the top electrode 136. For example, the bottom electrode 128 may be or comprise a same material of the diffusion barrier layer 132, such that the bottom electrode 128 is configured to prevent diffusion of the diffusive species to the data storage layer 130. In some embodiments, the diffusion barrier layer 132 and/or the active metal layer 134 may each be substantially free of the diffusive species. In further embodiments, an atomic percentage of the diffusive species (e.g., titanium, tantalum, and/or nitrogen) within the diffusion barrier layer 132 and/or the active metal layer 134 may be about 0 percent, less than 1 percent, less than 3 percent, or less than about 5 percent, such that the diffusion barrier layer 132 and/or the active metal layer 134 may each be substantially free of the diffusive species.

Figure 2:
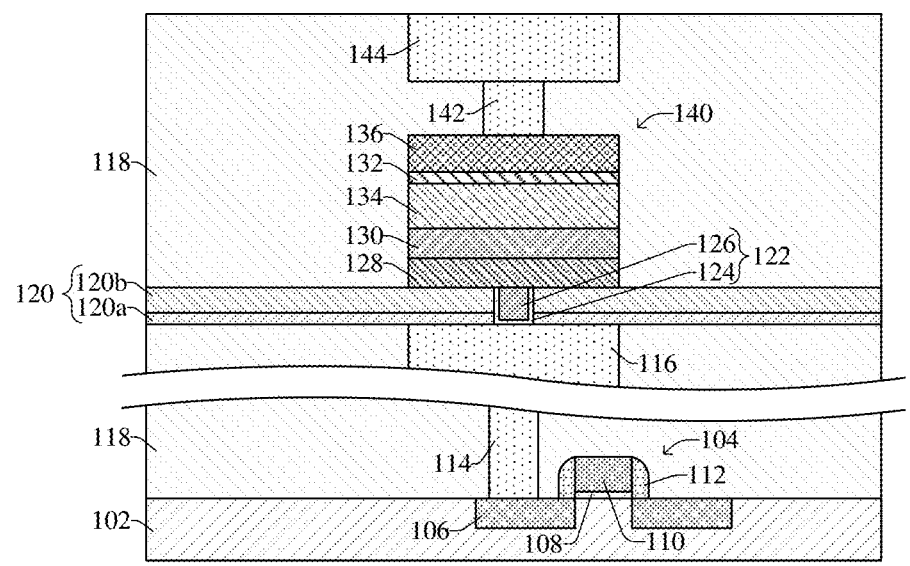
FIG. 2 illustrates a cross-sectional view of some embodiments of a memory device having a programmable metallization cell that includes a diffusion barrier layer overlying an active metal layer.

FIG. 2 illustrates a cross-sectional view of some embodiments of a memory device 200 according to some alternative embodiments of the memory device 100 of FIG. 1.

In some embodiments, the diffusion barrier layer 132 is disposed between the active metal layer 134 and the top electrode 136. The diffusion barrier layer 132 is configured to prevent and/or mitigate diffusion of the diffusive species from the top electrode 136 to the active metal layer 134 and/or the data storage layer 130. In further embodiments, a bottom surface of the diffusion barrier layer 132 directly contacts a top surface of the active metal layer 134 and a top surface of the diffusion barrier layer 132 directly contacts a bottom surface of the top electrode 136.

The dielectric structure 120 surrounds the bottom electrode via 122, between the programmable metallization cell 140 and the lower conductive wire 116. In some embodiments, the dielectric structure 120 is a multilayer film including a lower dielectric layer 120a and an upper dielectric layer 120b overlying the lower dielectric layer 120a. The lower and upper dielectric layers 120a, 120b are different materials. In some embodiments, the lower dielectric layer 120a may, for example, be or comprise silicon carbide, silicon oxy-carbide, or another suitable dielectric material. In further embodiments, the upper dielectric layer 120b may, for example, be or comprise silicon oxide (e.g., $SiO_2$), silicon nitride, or another suitable dielectric material. In alternative embodiments, the dielectric structure 120 is a single layer.

Figure 3:
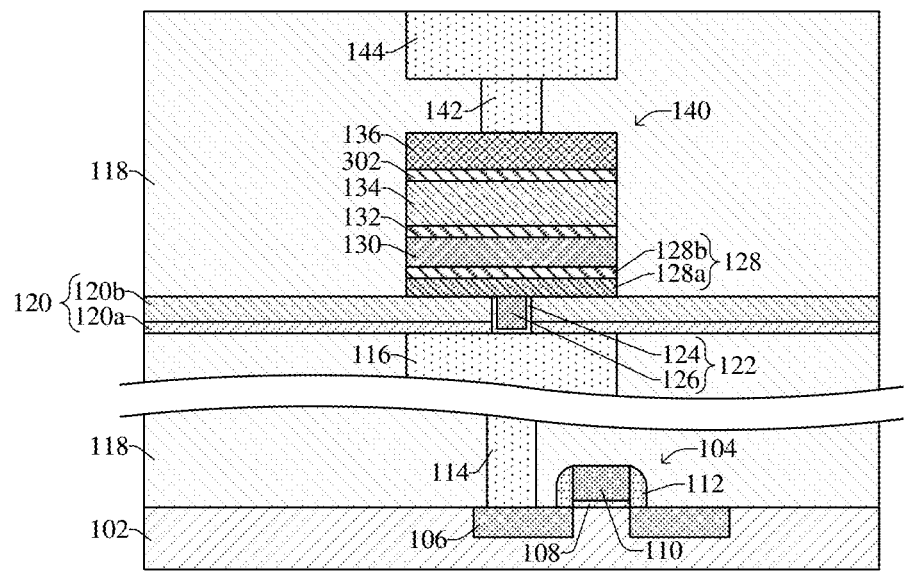
FIG. 3 illustrates a cross-sectional view of some embodiments of a memory device having a programmable metallization cell that includes a first diffusion barrier layer and a second diffusion barrier layer.

FIG. 3 illustrates a cross-sectional view of some embodiments of a memory device 300 according to some alternative embodiments of the memory device 100 of FIG. 1.

The memory device 300 includes a diffusion barrier layer 132 disposed between the data storage layer 130 and the active metal layer 134, and an upper diffusion barrier layer 302 disposed between the active metal layer 134 and the top electrode 136. In some embodiments, the upper diffusion barrier layer 302 may, for example, be or comprise ruthenium, tungsten, iridium, or the like and/or the upper diffusion barrier layer 302 is configured as the diffusion barrier layer 132. In some embodiments, the upper diffusion barrier layer 302 is configured to prevent diffusion of the diffusive species (e.g., titanium, tantalum, nitrogen) from the top electrode 136 to the active metal layer 134. In yet further embodiments, the upper diffusion barrier layer 302 comprises a same material as the diffusion barrier layer 132. Thus, the upper diffusion barrier layer 302 may further mitigate and/or prevent diffusion of the diffusive species to the data storage layer 130, thereby further increasing the performance, endurance, and reliability of the programmable metallization cell 140.

In further embodiments, the bottom electrode 128 comprises a first bottom electrode layer 128a and a second bottom electrode layer 128b overlying the first bottom electrode layer 128a. In some embodiments, the second bottom electrode layer 128b may be configured as the diffusion barrier layer 132, such that the second bottom electrode layer 128b is configured to prevent and/or block diffusion of the diffusive species from the first bottom electrode layer 128a and/or other underlying layers/structures to the data storage layer 130. In some embodiments, the first bottom electrode layer 128a may, for example, be or comprise titanium, tantalum, titanium nitride, tantalum nitride, or another suitable conductive material. In further embodiments, the second bottom electrode layer 128b may, for example, be or comprise ruthenium, tungsten, iridium, or the like and/or may have a thickness within a range of about 10 to 30 Angstroms. Thus, in some embodiments, the second bottom electrode layer 128b may be configured as a bottom electrode diffusion barrier layer and may further increase the performance, endurance, and reliability of the programmable metallization cell 140. Although the second bottom electrode layer 128b is illustrated in FIG. 3, it may be appreciated that the bottom electrode 128 of FIG. 1, 2, 4, 5, or 10-12 may each be configured as the bottom electrode 128 of FIG. 3. Thus, the bottom electrode 128 of FIG. 1, 2, 4, 5, or 10-12 may each comprise the second bottom electrode layer 128b overlying the first bottom electrode layer 128a, such that the second bottom electrode layer 128b is configured as the diffusion barrier layer 132 and blocks diffusion of the diffusive species.

Figure 4:
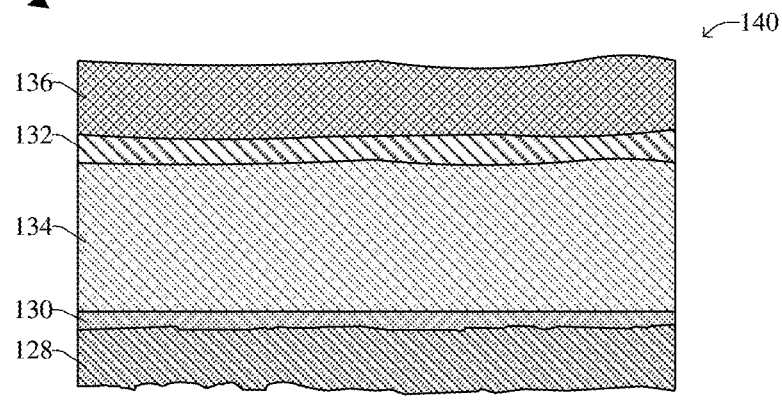
FIG. 4 illustrates a cross-sectional view of some embodiments of a memory cell including a diffusion barrier layer overlying an active metal layer.

FIG. 4 illustrates a cross-sectional view 400 of some embodiments of the programmable metallization cell 140 of FIG. 2.

In some embodiments, a thickness of the data storage layer 130 is less than a thickness of the diffusion barrier layer 132. In further embodiments, the thickness of the diffusion barrier layer 132 is less than a thickness of the bottom electrode 128 and/or a thickness of the top electrode 136. In yet further embodiments, the thickness of the diffusion barrier layer 132 is less than a thickness of the active metal layer 134.

In some embodiments, the thickness of the data storage layer 130 is within a range of about 10 to 50 Angstroms. In further embodiments, if the thickness of the data storage layer 130 is less than about 10 Angstroms, then a breakdown voltage of the programmable metallization cell 140 may be increased. In yet further embodiments, if the thickness of the data storage layer 130 is greater than 50 Angstroms, then the set and/or reset voltages may be increased in order to form or dissolve the conductive bridge within the data storage layer 130, thereby increasing a power consumption of the programmable metallization cell 140. In various embodiments, the thickness of the diffusion barrier layer 132 is within a range of about 10 to 30 Angstroms. In some embodiments, if the thickness of the diffusion barrier layer 132 is less than about 10 Angstroms, then an ability of the diffusion barrier layer 132 to prevent and/or block the diffusive species may be degraded. In further embodiments, if the thickness of the diffusion barrier layer 132 is greater than about 30 Angstroms, then the set and/or reset voltages may be increased to form and/or dissolve the conductive bridge, thereby increasing a power consumption of the programmable metallization cell 140.

Figure 5:
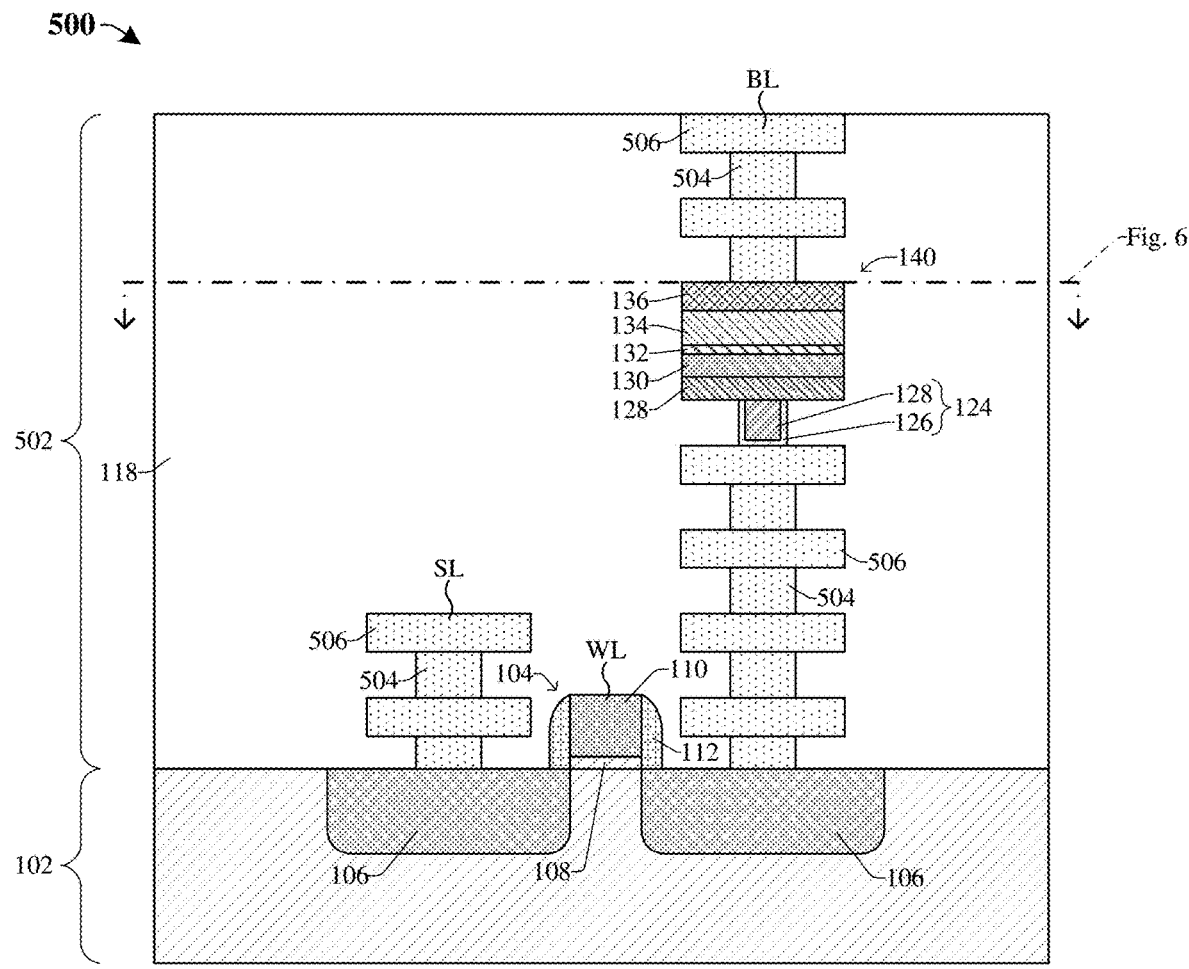
FIG. 5 illustrates a cross-sectional view of some embodiments of an integrated chip with a programmable metallization cell that includes a diffusion barrier layer, in which the programmable metallization cell is disposed within an interconnect structure.

FIG. 5 illustrates a cross-sectional view of some embodiments of an integrated chip 500 with an interconnect structure 502 and a programmable metallization cell 140 that includes a diffusion barrier layer 132. The programmable metallization cell 140 is disposed within the interconnect structure 502. In some embodiments, the programmable metallization cell 140 is configured as the programmable metallization cell 140 of FIG. 1, 2, or 3.

The integrated chip 500 includes the interconnect structure 502 overlying a substrate 102. In some embodiments, the substrate 102 may, for example, be a bulk substrate (e.g., a bulk silicon substrate), a silicon-on-insulator (SOI) substrate, or another suitable substrate and/or may comprise a first doping type (e.g., p-type). In some embodiments, a semiconductor device 104 is disposed within/on the substrate 102. In further embodiments, the semiconductor device 104 may be configured as an access transistor. In such embodiments, the semiconductor device 104 includes source/drain regions 106, a gate dielectric layer 108, a gate electrode 110, and a sidewall spacer structure 112. The source/drain regions 106 are disposed within the substrate 102 and may comprise a second doping type (e.g., n-type) opposite the first doping type (e.g., p-type). In some embodiments, the first doping type is p-type and the second doping type is n-type, or vice versa. The source/drain regions 106 may be disposed on opposite sides of the gate electrode 110. The gate dielectric layer 108 is disposed between the gate electrode 110 and the substrate 102. Further, the sidewall spacer structure 112 laterally surrounds sidewalls of the gate dielectric layer 108 and sidewalls of the gate electrode 110. In some embodiments, the gate dielectric layer 108 may, for example, be or comprise silicon dioxide, a high-k dielectric material, or another suitable dielectric material. In further embodiments, the gate electrode 110 may, for example, be or comprise polysilicon, a metal, such as aluminum, titanium, another suitable metal, or the like. In yet further embodiments, the sidewall spacer structure 112 may, for example, be or comprise silicon nitride, silicon carbide, another suitable dielectric material, or a combination of the foregoing.

The interconnect structure 502 includes an interconnect dielectric structure 118, a plurality of conductive vias 504, and a plurality of conductive wires 506. The plurality of conductive vias 504 and the plurality of conductive wires 506 are disposed within the interconnect dielectric structure 118 and are configured to electrically couple devices (e.g., the semiconductor device 104 and the programmable metallization cell 140) disposed within the integrated chip 500 together. The interconnect dielectric structure 118 may be or comprise a plurality of inter-level dielectric (ILD) layers. In some embodiments, the plurality of ILD layers may, for example, respectively be or comprise silicon dioxide, a low-k dielectric material, an extreme low-k dielectric layer, or the like. In further embodiments, the plurality of conductive vias and/or wires 504, 506 may respectively, for example, be or comprise aluminum, copper, tungsten, another suitable conductive material, or a combination of the foregoing. The programmable metallization cell 140 is disposed within the interconnect structure 502 between a lower layer of the conductive wires 506 and an upper layer of the conductive wires 506.

In some embodiments, the gate electrode 110 of the semiconductor device 104 is electrically coupled to a word line (WL). A source/drain region 106 of the semiconductor device 104 is electrically coupled to a source line (SL) by way of the interconnect structure 502. Further, the programmable metallization cell 140 is electrically coupled to a bit line (BL) by overlying conductive vias 504 and overlying conductive wires 506. In further embodiments, an output of the BL and/or the programmable metallization cell 140 may be accessed at the SL upon application of an appropriate WL voltage to the WL. In yet further embodiments, a set operation and/or a reset operation may be performed on the programmable metallization cell 140 by applying appropriate bias conditions to the BL, the SL, and/or the WL, such that a conductive bridge may be formed or dissolved within the data storage layer 130 of the programmable metallization cell 140. The diffusion barrier layer 132 is configured to prevent or mitigate diffusion of a diffusive species (e.g., titanium) from the top electrode 136 and/or the active metal layer 134 to the data storage layer 130. This may increase a number of set and/or reset operations that may be performed on the programmable metallization cell 140.

Figure 6:
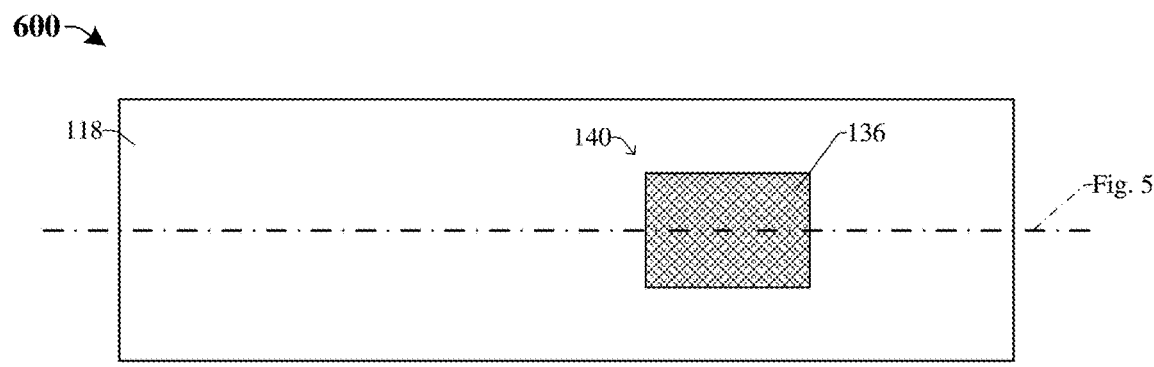
FIG. 6 illustrates a top view of some alternative embodiments of the integrated chip of FIG. 5, as indicated by the line in FIG. 5.

FIG. 6 illustrates a top view 600 of some alternative embodiments of the integrated chip 500 of FIG. 5 taken along the line in FIG. 5.

In some embodiments, as illustrated in FIG. 6, the programmable metallization cell 140 and/or the top electrode 136 may each have a rectangular shape or a square shape when viewed from above. In further embodiments, when viewed from above, the programmable metallization cell 140 may have a circular shape or an elliptical shaped when viewed from above (not shown).

FIGS. 7-12 illustrate cross-sectional views 700-1200 of some embodiments of a method for forming a memory device having a programmable metallization cell that includes a diffusion barrier layer. Although the cross-sectional views 700-1200 shown in FIGS. 7-12 are described with reference to a method, it will be appreciated that the structures shown in FIGS. 7-12 are not limited to the method but rather may stand alone separate of the method. Further, although FIGS. 7-12 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
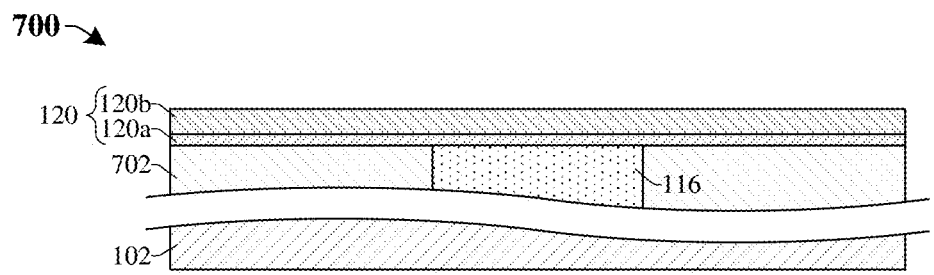
FIGS. 7-12 illustrate cross-sectional views of some embodiments of a method for forming a memory device having a programmable metallization cell that includes a diffusion barrier layer.

As shown in cross-sectional view 700 of FIG. 7, a lower inter-level dielectric (ILD) structure 702 is formed over a substrate 102 and a lower conductive wire 116 is formed within the lower ILD structure 702. Further, a dielectric structure 120 is formed over the lower ILD structure 702. In some embodiments, the lower ILD structure 702 and/or the dielectric structure 120 may, for example, each be deposited by chemical vapor deposition (CVD), physical vapor deposition (PVD), atomic layer deposition (ALD) or another suitable deposition or growth process. In further embodiments, the lower conductive wire 116 may be formed by a single damascene process or a dual damascene process. In some embodiments, the dielectric structure 120 may include a lower dielectric layer 120a and an upper dielectric layer 120b overlying the lower dielectric layer 120a. In some embodiments, the lower ILD structure 702 may, for example, be or comprise silicon dioxide, a low-k dielectric material, an extreme low-k dielectric material, a combination of the foregoing, or the like. In further embodiments, the lower dielectric layer 120a may, for example, be or comprise silicon carbide, silicon oxy-carbide, or the like. In yet further embodiments, the upper dielectric layer 120b may, for example, be or comprise silicon oxide, silicon nitride, or the like.

Figure 8:
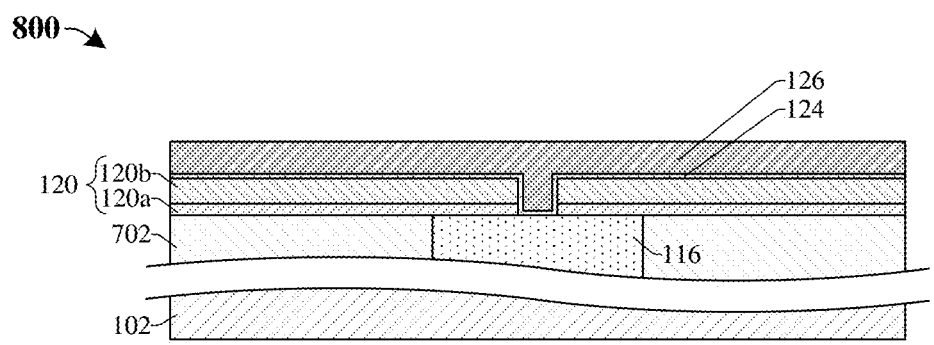

As shown in cross-sectional view 800 of FIG. 8, a conductive liner 124 and a conductive structure 126 are formed over the lower conductive wire 116. In some embodiments, before forming the conductive liner 124 and the conductive structure 126, the dielectric structure 120 is patterned to form a bottom electrode via opening, thereby exposing an upper surface of the lower conductive wire 116. After forming the bottom electrode via opening, the conductive liner 124 is deposited over the lower conductive wire 116 and the dielectric structure 120, such that the conductive liner 124 at least partially lines the bottom electrode via opening. In further embodiments, after forming the conductive liner 124, the conductive structure 126 is deposited over the conductive liner 124. In some embodiments, the conductive structure 126 fills a remaining portion of the bottom electrode via opening. In further embodiments, the conductive liner 124 and/or the conductive structure 126 may, for example, each be deposited by CVD, PVD, electroless plating, electroplating, sputtering, or another suitable growth or deposition process. In some embodiments, the conductive liner 124 may, for example, be or comprise tantalum nitride and/or some other suitable conductive liner material(s). In further embodiments, the conductive structure 126 may, for example, be or comprise titanium nitride and/or some other suitable conductive material(s).

Figure 9:
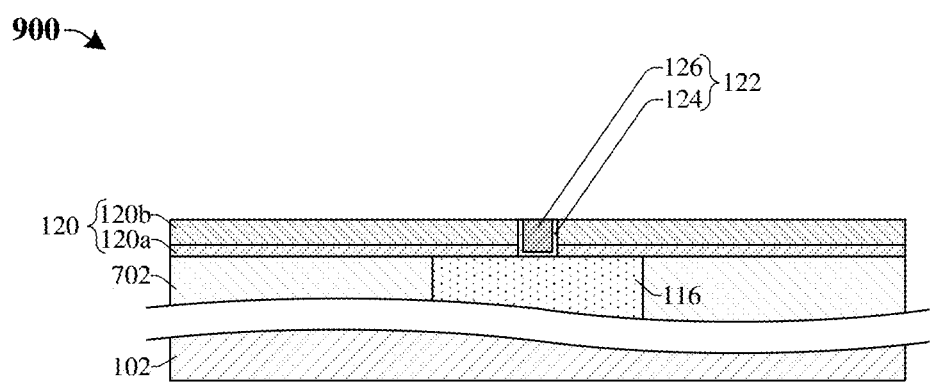

As shown in cross-sectional view 900 of FIG. 9, a planarization process is performed on the conductive liner 124 and the conductive structure 126 until an upper surface of the dielectric structure 120 is reached, thereby defining a bottom electrode via 122. In some embodiments, the planarization process may include performing a chemical mechanical planarization (CMP) process.

Figure 10:
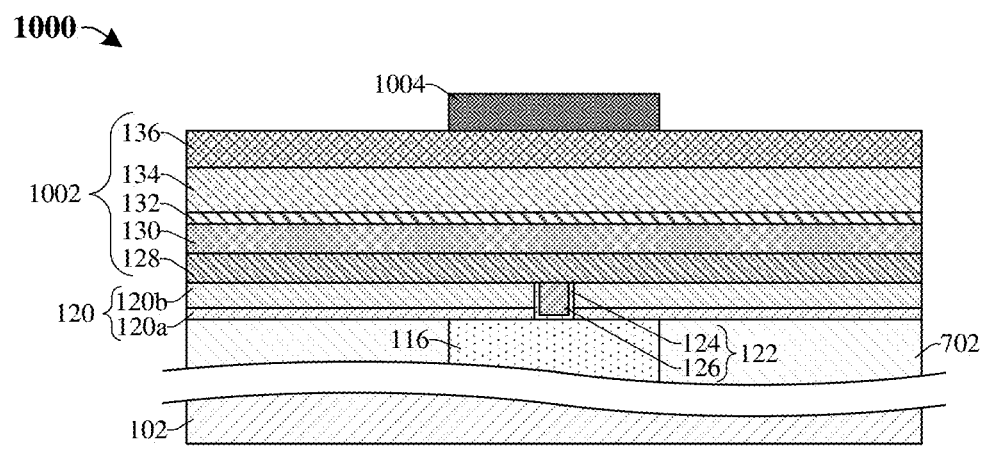

As shown in cross-sectional view 1000 of FIG. 10, a memory cell layer stack 1002 is formed over the dielectric structure 120 and the bottom electrode via 122. In some embodiments, the memory cell layer stack 1002 includes a bottom electrode 128, a data storage layer 130, a diffusion barrier layer 132, an active metal layer 134, and a top electrode 136. In further embodiments, the diffusion barrier layer 132 may be disposed between the data storage layer 130 and the top electrode 136. In some embodiments, the top electrode 136 is formed in such a manner that it comprises a diffusive species (e.g., titanium, tantalum, nitrogen, a combination of the foregoing, or the like). The diffusion barrier layer 132 is configured to prevent diffusion of the diffusive species from the top electrode 136 and/or the active metal layer 134 to the data storage layer 130. In some embodiments, each layer within the memory cell layer stack 1002 may, for example, be deposited by CVD, PVD, ALD, sputtering, co-sputtering, or another suitable growth or deposition process. Further, after depositing layers of the memory cell layer stack 1002, a masking layer 1004 may be formed over the memory cell layer stack 1002. In some embodiments, the masking layer 1004 may be or comprise a photoresist, a hard masking layer, or the like.

Figure 11:
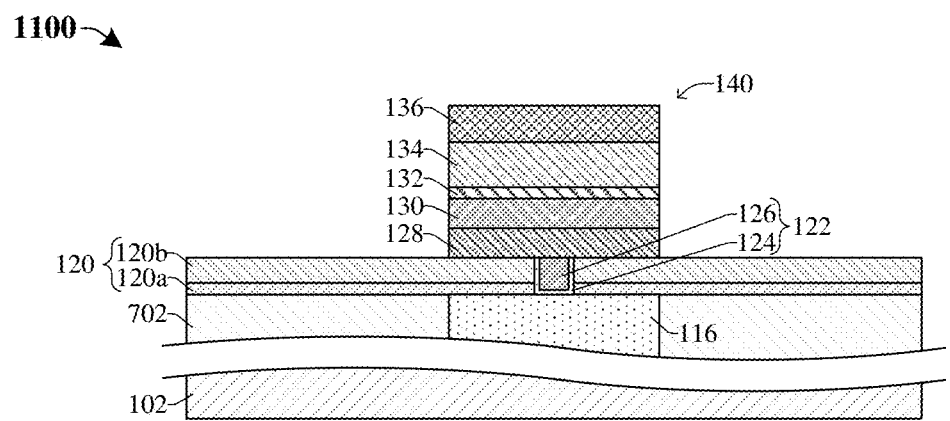

As shown in cross-sectional view 1100 of FIG. 11, the memory cell layer stack 1002 is patterned according to the masking layer (1004 of FIG. 10), thereby defining a programmable metallization cell 140. In some embodiments, the patterning process includes exposing unmasked regions of layers within the memory cell layer stack 1002 to one or more etchants and subsequently performing a removal process to remove the masking layer (1004 of FIG. 10).

Figure 12:
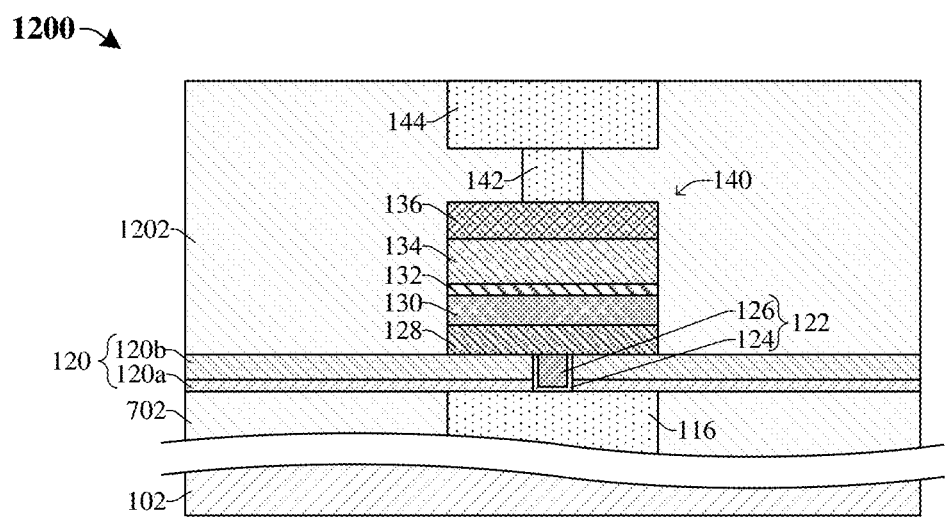

As shown in cross-sectional view 1200 of FIG. 12, an upper ILD structure 1202 is formed over the dielectric structure 120 and the programmable metallization cell 140. In some embodiments, the upper ILD structure 1202 may be formed by, for example, CVD, PVD, ALD, or another suitable deposition or growth process. In further embodiments, the upper ILD structure 1202 may, for example, be or comprise silicon dioxide, a low-k dielectric material, an extreme low-k dielectric material, or another suitable dielectric material. Further, an upper conductive via 142 and an upper conductive wire 144 are formed over the programmable metallization cell 140. In some embodiments, the upper conductive via and/or wire 142, 144 may, for example, respectively be or comprise aluminum, copper, tungsten, another suitable dielectric material, or a combination of the foregoing. In further embodiments, the upper conductive via 142 and/or the upper conductive wire 144 may each be formed by a single damascene process or a dual damascene process.

In some embodiments, after forming the programmable metallization cell 140, a baking process is performed on the programmable metallization cell 140 to verify data retention of the programmable metallization cell 140 at high temperatures. Further, set and/or reset operations may be performed on the programmable metallization cell 140 after performing the baking process. In some embodiments, the baking process may reach a high temperature of about 400 degrees Celsius and/or may maintain the high temperature for a duration of about 30 minutes. In some embodiments, if, for example, the diffusion barrier layer 132 is omitted (not shown), then the baking process may cause diffusion of the diffusive species from the top electrode 136 to the active metal layer 134 and/or the data storage layer 130. This in turn may result in a reduced number of set and/or reset operations that may be performed on the programmable metallization cell 140 and/or may reduce an effective thickness of the data storage layer 130. However, according to embodiments of the present disclosure, the diffusion barrier layer 132 is disposed between the data storage layer 130 and the top electrode 136 and is configured to prevent diffusion of the diffusive species from the top electrode 136 to the data storage layer 130 during the baking process. This in part may be because the diffusion barrier layer 132 increases a diffusion-path complexity for the diffusive species, such that the diffusive species may not traverse the diffusion barrier layer 132 to the data storage layer 130. In addition, a diffusion activation temperature of the diffusion barrier layer 132 is greater than the high temperature (e.g., about 400 degrees Celsius) of the baking process, such that atoms within the diffusion barrier layer 132 do not diffuse out of the diffusion barrier layer 132 during the baking process.

In some embodiments, after performing the baking process, the data storage layer 130 and/or the active metal layer 134 may each be substantially free of the diffusive species. For example, an atomic percentage of the diffusive species (e.g., titanium, tantalum, and/or nitrogen) within the data storage layer 130 and/or the active metal layer 134 may be about 0 percent, less than 1 percent, less than 3 percent, or less than 5 percent, such that the data storage layer 130 and/or the active metal layer 134 are each substantially free of the diffusive species. In further embodiments, an atomic percentage of the diffusive species (e.g., titanium, tantalum, and/or nitrogen) within the diffusion barrier layer 132 may be about 0 percent, less than 1 percent, less than 3 percent, or less than 5 percent, such that the diffusion barrier layer 132 is substantially free of the diffusive species after the baking process. Thus, the diffusive species may not diffuse from the top electrode 136 during the baking process. In yet further embodiments, the bottom electrode 128 may comprise a bottom electrode diffusion barrier layer (not shown) that is configured as the diffusion barrier layer 132 (e.g., see FIG. 3), such that the diffusive species is blocked from diffusing from the bottom electrode 128 to the data storage layer 130 during the baking process.

In further embodiments, a formation temperature of an alloy comprising the diffusive species (e.g., titanium) and a material (e.g., tungsten, ruthenium, or iridium) of the diffusion barrier layer 132 is greater than the high temperature (e.g., 400 degrees Celsius) of the baking process. This, in part, further prevents and/or mitigates diffusion of the diffusive species into the diffusion barrier layer 132 and/or layer(s)/structure(s) underlying the diffusion barrier layer 132. In some embodiments, a formation temperature of a titanium-ruthenium (Ti—Ru) alloy, a formation temperature of a titanium-iridium (Ti—Ir) alloy, and/or a formation temperature of a titanium-tungsten (Ti—W) alloy are each greater than 400 degrees Celsius.

Figure 13:
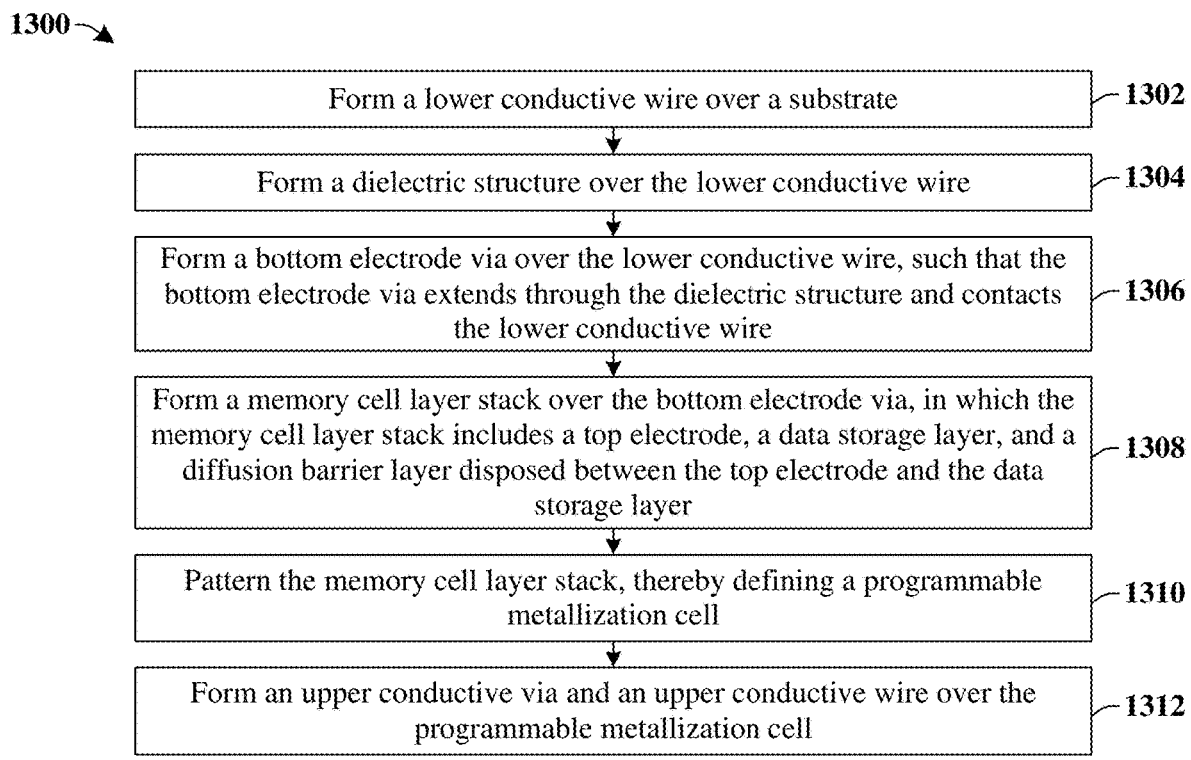
FIG. 13 illustrates a method in flowchart format that includes some embodiments of a method for forming a memory device having a programmable metallization cell that includes a diffusion barrier layer.

FIG. 13 illustrates a method 1300 of forming a memory device having a programmable metallization cell that includes a diffusion barrier layer according to the present disclosure. Although the method 1300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1302, a lower conductive wire is formed over a substrate. FIG. 7 illustrates a cross-sectional view 700 corresponding to some embodiments of act 1302.

At act 1304, a dielectric structure is formed over the lower conductive wire. FIG. 7 illustrates a cross-sectional view 700 corresponding to some embodiments of act 1304.

At act 1306, a bottom electrode via is formed over the lower conductive wire, such that the bottom electrode via extends through the dielectric structure and contacts the lower conductive wire. FIGS. 8 and 9 illustrate cross-sectional views 800 and 900 corresponding to some embodiments of act 1306.

At act 1308, a memory cell layer stack is formed over the bottom electrode via. The memory cell layer stack includes a top electrode, a data storage layer, and a diffusion barrier layer disposed between the top electrode and the data storage layer. FIG. 10 illustrates a cross-sectional view 1000 corresponding to some embodiments of act 1308.

At act 1310, the memory cell layer stack is patterned, thereby defining a programmable metallization cell. FIG. 11 illustrates a cross-sectional view 1100 corresponding to some embodiments of act 1310.

At act 1312, an upper conductive via and an upper conductive wire are formed over the programmable metallization cell. FIG. 12 illustrates a cross-sectional view 1200 corresponding to some embodiments of act 1312.

Accordingly, in some embodiments, the present application relates to a programmable metallization cell including a bottom electrode, a data storage layer, a top electrode, and a diffusion barrier layer, in which the diffusion barrier layer is configured to prevent diffusion of a diffusive species to the data storage layer.

In various embodiments, the present application provides a memory device including a substrate; a bottom electrode overlying the substrate; a data storage layer overlying the bottom electrode; a top electrode overlying the data storage layer, wherein a conductive bridge is selectively formable within the data storage layer to couple the bottom electrode to the top electrode; and a diffusion barrier layer disposed between the data storage layer and the top electrode.

In various embodiments, the present application provides an integrated chip including a substrate; a bottom electrode via overlying the substrate; and a programmable metallization cell overlying the bottom electrode via, wherein the programmable metallization cell includes a top electrode, a data storage layer, an active metal layer, and a diffusion barrier layer, wherein the top electrode comprises a diffusive species, wherein the top electrode has a lower reactivity to oxygen than the active metal layer, wherein the active metal layer is disposed between the top electrode and the data storage layer, and wherein the diffusion barrier layer underlies the top electrode and is configured to prevent diffusion of the diffusive species to the data storage layer.

In various embodiments, the present application provides a method for forming a memory device, the method including forming a lower conductive wire over a substrate; forming a bottom electrode via over the lower conductive wire; forming a memory cell layer stack over the bottom electrode via, wherein the memory cell layer stack includes a bottom electrode, a data storage layer, a diffusion barrier layer, and a top electrode, wherein the diffusion barrier layer is disposed between the data storage layer and the top electrode, wherein the top electrode comprises a diffusive species, and wherein the diffusion barrier layer is configured to block diffusion of the diffusive species; and patterning the memory cell layer stack, thereby defining a programmable metallization cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:
forming a bottom electrode over a substrate;
forming a data storage layer on the bottom electrode;
forming a diffusion barrier layer over the data storage layer, wherein the diffusion barrier layer has a first diffusion activation temperature; and
forming a top electrode over the diffusion barrier layer, wherein the top electrode has a second diffusion activation temperature less than the first diffusion activation temperature.

2. The method of claim 1, wherein a thickness of the diffusion barrier layer is less than a thickness of the bottom electrode and a thickness of the top electrode.

3. The method of claim 1, wherein a formation temperature of the top electrode is greater than the second diffusion activation temperature.

4. The method of claim 1, further comprising:
performing a baking process on the data storage layer after forming the top electrode, wherein a high temperature of the baking process is greater than the second diffusion activation temperature.

5. The method of claim 4, wherein the diffusion barrier layer is configured to mitigate diffusion of a diffusive species from the top electrode during the baking process.

6. The method of claim 1, wherein the first diffusion activation temperature is greater than about 400 degrees Celsius and the second diffusion activation temperature is less than about 400 degrees Celsius.

7. The method of claim 1, further comprising:
forming an active metal layer between the top electrode and the data storage layer, wherein the active metal layer depends upon a first energy to oxidize and the top electrode depends upon a second energy to oxidize greater than the first energy.

8. The method of claim 7, wherein the active metal layer directly contacts the diffusion barrier layer.

9. A method for forming an integrated chip, comprising:
forming a bottom electrode via over a substrate;
forming a memory cell layer stack over the bottom electrode via, wherein the memory cell layer stack comprises a bottom electrode, a data storage layer over the bottom electrode, a diffusion barrier layer over the data storage layer, and a top electrode over the diffusion barrier layer, wherein a first conductive material of the diffusion barrier layer is different from a second conductive material of the top electrode, and wherein a conductive bridge is formable and dissolvable within a middle region of the data storage layer; and
etching the memory cell layer stack to define a memory cell over the bottom electrode via.

10. The method of claim 9, wherein the first conductive material comprises ruthenium and/or iridium.

11. The method of claim 9, wherein a thickness of the diffusion barrier layer is within a range of about 10 to 50 angstroms.

12. The method of claim 9, wherein sidewalls of the bottom electrode, sidewalls of the data storage layer, sidewalls of the diffusion barrier layer, and sidewalls of the top electrode are substantially straight and aligned with one another.

13. The method of claim 9, wherein the diffusion barrier layer comprises equiaxed grains with grain sizes that are smaller than grain sizes of the top electrode.

14. The method of claim 9, wherein a formation temperature of the top electrode is greater than a first diffusion activation temperature of the top electrode, and wherein a second diffusion activation temperature of the diffusion barrier layer is greater than the first diffusion activation temperature.

15. The method of claim 9, wherein forming the bottom electrode via comprises:
forming a dielectric structure over the substrate;
patterning the dielectric structure to form an opening in the dielectric structure;
depositing a conductive liner and a conductive structure within the opening; and
performing a planarization process on the conductive liner and the conductive structure.

16. The method of claim 9, further comprising:
forming an upper conductive via over the top electrode; and
forming an upper conductive wire over the upper conductive via.

17. A method for forming a memory device, the method comprising:
forming a lower conductive wire over a substrate;
forming a bottom electrode via over the lower conductive wire;
forming a memory cell layer stack over the bottom electrode via, wherein the memory cell layer stack includes a bottom electrode, a data storage layer, a diffusion barrier layer, and a top electrode, wherein the diffusion barrier layer is disposed between the data storage layer and the top electrode, wherein the top electrode comprises a diffusive species, and wherein the diffusion barrier layer is configured to block diffusion of the diffusive species; and
patterning the memory cell layer stack, thereby defining a programmable metallization cell.

18. The method of claim 17, wherein after patterning the memory cell layer stack sidewalls of the top electrode, sidewalls of the data storage layer, and sidewalls of the diffusion barrier layer are respectively aligned.

19. The method of claim 17, further comprising:
performing a baking process on the programmable metallization cell, wherein the baking process reaches a high temperature of about 400 degrees Celsius, wherein the data storage layer is substantially free of the diffusive species after performing the baking process.

20. The method of claim 19, wherein a diffusion activation temperature of the top electrode is less than the high temperature.

* * * * *